(12) United States Patent
Nimran et al.

(10) Patent No.: US 11,831,283 B2
(45) Date of Patent: *Nov. 28, 2023

(54) TIME GAIN COMPENSATION CIRCUIT IN AN ULTRASOUND RECEIVER

(71) Applicant: Texas Instruments Incorporated, Dallas, TX (US)

(72) Inventors: Vajeed Nimran, Bangalore (IN); Raja Sekhar, Bangalore (IN); Sandeep Oswal, Bangalore (IN); Shagun Dusad, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/210,251

(22) Filed: Mar. 23, 2021

(65) Prior Publication Data

US 2021/0211102 A1    Jul. 8, 2021

Related U.S. Application Data

(60) Division of application No. 15/980,771, filed on May 16, 2018, now Pat. No. 10,985,708, which is a continuation of application No. 14/637,146, filed on Mar. 3, 2015, now abandoned.

(51) Int. Cl.
| | |
|---|---|
| *H03F 1/56* | (2006.01) |
| *H03G 1/00* | (2006.01) |
| *G01S 7/52* | (2006.01) |
| *H03F 3/45* | (2006.01) |
| *H03G 3/30* | (2006.01) |

(52) U.S. Cl.
CPC ........... *H03F 1/56* (2013.01); *H03F 3/45475* (2013.01); *G01S 7/52033* (2013.01); *H03F 2203/45134* (2013.01); *H03F 2203/45151* (2013.01); *H03F 2203/45528* (2013.01); *H03F 2203/45591* (2013.01); *H03G 1/0035* (2013.01); *H03G 3/301* (2013.01); *H03G 3/3005* (2013.01)

(58) Field of Classification Search
CPC ............ H03F 1/56; H03F 2203/45134; H03F 2203/45151

See application file for complete search history.

(56) References Cited

U.S. PATENT DOCUMENTS

| | | | |
|---|---|---|---|
| 6,081,603 A | 6/2000 | Engh et al. | |
| 6,524,244 B1 | 2/2003 | Knell et al. | |
| 6,933,786 B1 | 8/2005 | Mohandas et al. | |
| 2015/0280662 A1 | 10/2015 | Nimran et al. | |

OTHER PUBLICATIONS

"Time-Gain-Compensation Amplifier for Ultrasonic Echo Signal Processing," Yao Jiajian, Delft University of Technology. Feb. 2010 (81 pages).

*Primary Examiner* — Jason M Ip
(74) *Attorney, Agent, or Firm* — John R. Pessetto; Frank D. Cimino

(57) ABSTRACT

The disclosure provides a time gain compensation (TGC) circuit. The TGC circuit includes an impedance network. A differential amplifier is coupled to the impedance network. The differential amplifier includes a first input port, a second input port, a first output port and a second output port. A first feedback resistor is coupled between the first input port and the first output port. A second feedback resistor is coupled between the second input port and the second output port. The impedance network provides a fixed impedance to the differential amplifier when a gain of the TGC circuit is changed from a maximum value to a minimum value.

19 Claims, 3 Drawing Sheets

TIME GAIN COMPENSATION CIRCUIT IN AN ULTRASOUND RECEIVER

CROSS REFERENCES TO RELATED APPLICATIONS

This application is a division of U.S. patent application Ser. No. 15/980,771, filed May 16, 2018, which is a continuation of U.S. patent application Ser. No. 14/637,146, filed Mar. 3, 2015, which claims priority to India Provisional Patent Application No. 1629/CHE/2014, filed Mar. 27, 2014, the contents of all of which are herein incorporated by reference in their entirety.

TECHNICAL FIELD

The present disclosure is generally related to medical diagnostic devices, and more particularly to time gain compensation in ultrasound receivers.

BACKGROUND

Ultrasonic imaging has become a widely used tool in medical diagnostics. Ultrasound techniques introduce high-frequency acoustic waves into a subject's body. Ultrasound system uses transducers that convert electrical energy into acoustic energy. The ultrasound signals are transmitted to the subject's body, from an ultrasound probe, and, in response, echoes of the acoustic energy are reflected from various acoustic impedance discontinuities within the body.

The echoes are received by the transducer integrated within the ultrasound system. The echoes (or the reflected ultrasound signals) are amplified and digitized to generate an ultrasound image of the subject. The received echoes of those waves provide information allowing a trained observer to view the subject's internal organs.

The ultrasound signals are attenuated when passed through body tissues. Therefore, echoes received from further within the body have much less intensity than echoes received from the same type of tissue boundaries which are close to the surface of the body. The amplitude of the echoes or the reflected ultrasound signals varies dynamically, and hence an ADC (analog to digital converter) with large dynamic range is required in the ultrasound system.

A time gain compensation (TGC) circuit is used in an ultrasound system to correct the intensity of the echoes so that the intensities are almost the same for echoes received from tissues deep within the body as they are for similar tissues close to the surface of the body. The TGC circuit increases the signal intensity with depth to attain a same dynamic range across signal levels. However, the TGC circuit requires a high power to meet the low noise requirements in the ultrasound system.

SUMMARY

According to an aspect of the disclosure, a time gain compensation (TGC) circuit is disclosed. The TGC circuit includes an impedance network. A differential amplifier is coupled to the impedance network. The differential amplifier includes a first input port, a second input port, a first output port and a second output port. A first feedback resistor is coupled between the first input port and the first output port. A second feedback resistor is coupled between the second input port and the second output port. The impedance network provides a fixed impedance to the differential amplifier when a gain of the TGC circuit is changed from a maximum value to a minimum value.

BRIEF DESCRIPTION OF THE VIEWS OF DRAWINGS

DETAILED DESCRIPTION OF THE EMBODIMENTS

Figure 1:
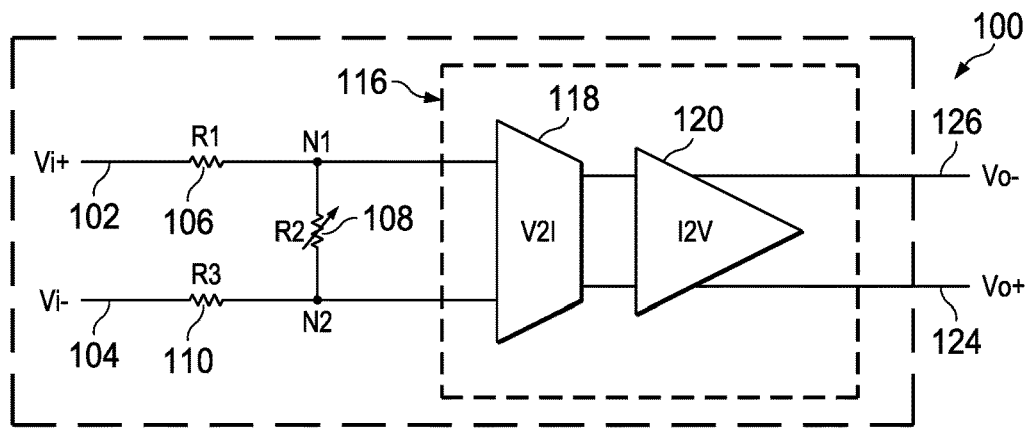
FIG. 1 illustrates a time gain compensation (TGC) circuit.

FIG. 1 illustrates a time gain compensation (TGC) circuit 100. The TGC circuit 100 receives a differential input. The differential input includes a positive input voltage Vi+ 102 and a negative input voltage Vi– 104. The TGC circuit 100 includes a first resistor R1 106, a second resistor R2 108 and a third resistor R3 110. The first resistor R1 106 and the third resistor R3 110 are fixed resistors. The second resistor R2 108 is a voltage controlled resistor.

The second resistor R2 108 is coupled between a first node N1 and a second node N2. An amplifier 116 is coupled to the first node N1 and the second node N2. The amplifier 116 includes a voltage-to-current (V2I) converter 118 followed by current-to-voltage (I2V) converter 120. The amplifier 116 generates a differential output. The differential output includes a positive output voltage Vo+ 124 and a negative output voltage Vo– 126.

The operation of the TGC circuit 100 illustrated in FIG. 1 is explained now. A resistance value of the first resistor R1 106 and the third resistor R3 110 are equal. The amplifier 116 is a fixed gain amplifier. The amplifier 116 has a high input impedance since it is implemented using a V2I converter 118 and I2V converter 120.

The TGC circuit 100 receives the differential input. A resistance value of the second resistor R2 108 is changed to vary a gain of the TGC circuit 100. The TGC circuit 100 thus provides a higher gain to a low intensity differential input and a lower gain to a high intensity differential input.

A noise of the amplifier 116 does not change with the gain of the TGC circuit 100. However, amplifier 116 is a high power amplifier, since amplifier 116 has a high input impedance and a fixed gain. Thus, the TGC circuit 100 requires a higher power to meet a low noise requirement of an ultrasound system in which TGC circuit 100 is used.

Figure 2:
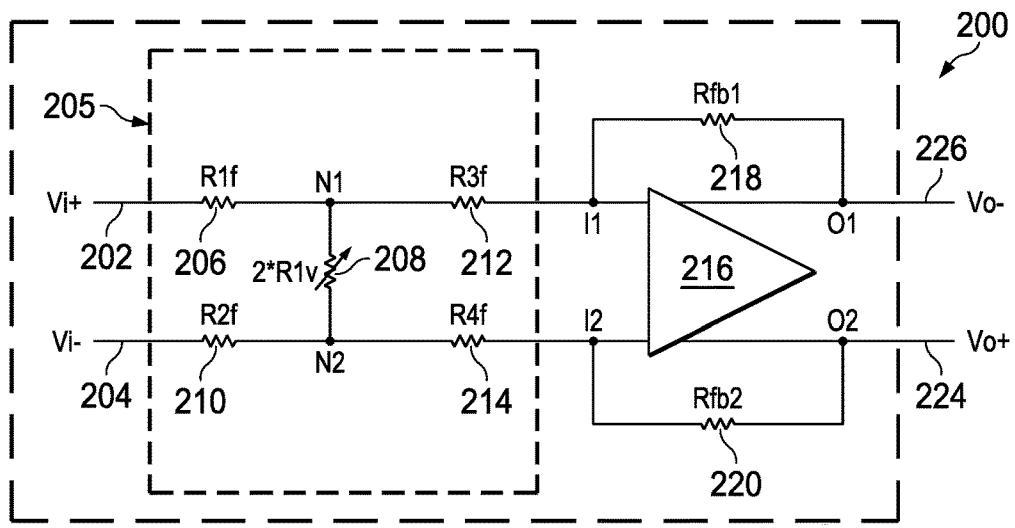
FIG. 2 illustrates a time gain compensation (TGC) circuit, according to an embodiment.

FIG. 2 illustrates a time gain compensation (TGC) circuit 200, according to an embodiment. The TGC circuit 200 receives a differential input. The differential input includes a positive input voltage Vi+ 202 and a negative input voltage Vi– 204. An impedance network 205 receives the positive input voltage Vi+ 202 and the negative input voltage Vi– 204. The impedance network 205 includes a first fixed resistor R1f 206, a second fixed resistor R2f 210, a third fixed resistor R3f 212, a fourth fixed resistor R4f 214 and a first voltage controlled resistor R1v 208.

A resistance value of the first voltage controlled resistor R1v 208 is considered as 2*R1v for ease in computation of a gain of the TGC circuit 200. The first fixed resistor R1f 206, the second fixed resistor R2f 210, the third fixed resistor R3f 212 and the fourth fixed resistor R4f 214 are fixed resistors. The first voltage controlled resistor R1v 208 is a voltage controlled resistor.

The first fixed resistor R1f 206 is coupled to a first node N1 and receives the positive input voltage Vi+ 202. The second fixed resistor R2f 210 is coupled to a second node N2 and receives the negative input voltage Vi− 204. The first voltage controlled resistor R1v 208 is coupled between the first node N1 and the second node N2.

A differential amplifier 216 is coupled to the impedance network 205. The differential amplifier 216 includes a first input port I1, a second input port I2, a first output port O1 and a second output port O2. The differential amplifier 216 generates a differential output. The differential output includes a positive output voltage Vo+ 224 and a negative output voltage Vo− 226.

The negative output voltage Vo− 226 is generated at the first output port O1, and the positive output voltage Vo+ 224 is generated at the second output port O2. The third fixed resistor R3f 212 is coupled between the first node N1 and the first input port I1. The fourth fixed resistor R4f is coupled between the second node N2 and the second input port I2.

A first feedback resistor Rfb1 218 is coupled between the first input port I1 and the first output port O1. A second feedback resistor Rfb2 is coupled between the second input port I2 and the second output port O2. It is understood that the impedance network 205 is symmetric. Thus, in an example, when the positive input voltage Vi+ 202 and the negative input voltage Vi− 204 are provided to the second node N2 and the first node N1 respectively, the negative output voltage Vo− and the 226 positive output voltage Vo+ 224 may be generated at second output port O2 and first output port O1 respectively.

The TGC circuit 200 may include one or more additional components known to those skilled in the relevant art and are not discussed here for simplicity of the description.

The operation of the TGC circuit 200 illustrated in FIG. 1 is explained now. In one example, a resistance value of the first fixed resistor R1f 206 and the second fixed resistor R2f 210 are equal. Also, a resistance value of the third fixed resistor R3f 212 and the fourth fixed resistor R4f 214 are equal. In another example, a resistance value of the first feedback resistor Rfb1 218 and the second feedback resistor Rfb2 220 are equal.

The differential amplifier 216 is at least one of an operational amplifier and a high gain amplifier. In one example, a gain of the differential amplifier 216 is greater than 1000. The TGC circuit 200 receives the differential input (the positive input voltage Vi+ 202 and the negative input voltage Vi− 204). Based on the differential input, a resistance value of the first voltage controlled resistor R1v 208 is changed to vary a gain of the TGC circuit 200. The TGC circuit 200 thus provides a higher gain to a low intensity differential input and a lower gain to a high intensity differential input.

The TGC circuit 200 requires very less power as compared to the TGC circuit 100 to meet the same noise requirement in an ultrasound system. This is because the TGC circuit 200 uses differential amplifier 216 which is an operational amplifier, and in the TGC circuit 100, amplifier 116 is a high power amplifier, since amplifier 116 has high input impedance and fixed gain However, a noise of the differential amplifier 216 is higher when the gain of the TGC circuit 200 is low as compared to when the gain of the TGC circuit 200 is high. The ultrasound system using a TGC circuit requires a differential amplifier to have a low noise at low gain condition.

Figure 3:
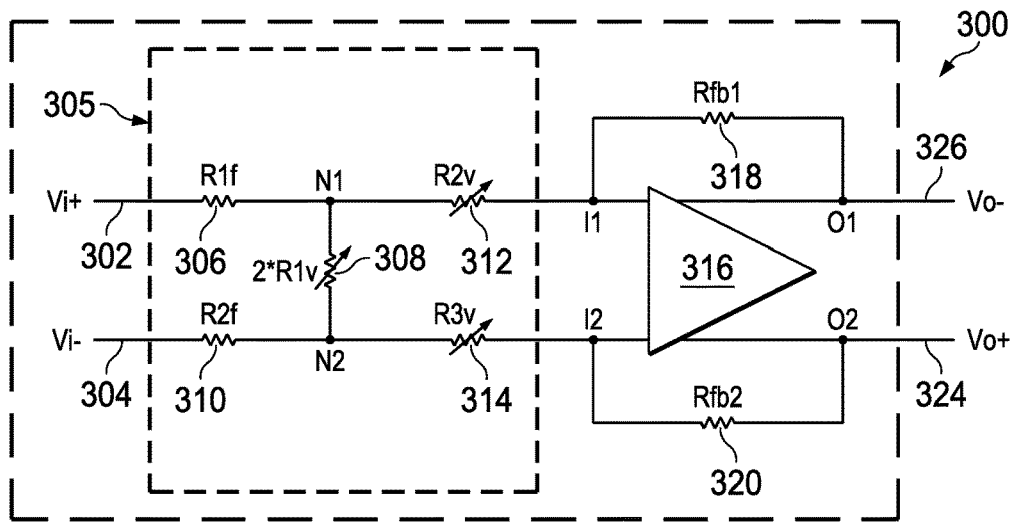
FIG. 3 illustrates a time gain compensation (TGC) circuit, according to an embodiment.

FIG. 3 illustrates a time gain compensation (TGC) circuit 300, according to an embodiment. The TGC circuit 300 receives a differential input. The differential input includes a positive input voltage Vi+ 302 and a negative input voltage Vi− 304. An impedance network 305 receives the positive input voltage Vi+ 302 and the negative input voltage Vi− 304.

The impedance network 305 includes a first fixed resistor R1f 306, a second fixed resistor R2f 310, a first voltage controlled resistor R1v 308, a second voltage controlled resistor R2v 312 and a third voltage controlled resistor R3v 314. In one version, the impedance network 305 includes one or more voltage controlled resistors.

A resistance value of the first voltage controlled resistor R1v 308 is considered as 2*R1v for ease in computation of a gain of the TGC circuit 300. The first fixed resistor R1f 306 and the second fixed resistor R2f 310 are fixed resistors. The first voltage controlled resistor R1v 308, the second voltage controlled resistor R2v 312 and the third voltage controlled resistor R3v 314 are a voltage controlled resistors.

The first fixed resistor R1f 306 is coupled to a first node N1 and receives the positive input voltage Vi+ 302. The second fixed resistor R2f 310 is coupled to a second node N2 and receives the negative input voltage Vi− 304. The first voltage controlled resistor R1v 308 is coupled between the first node N1 and the second node N2.

A differential amplifier 316 is coupled to the impedance network 305. The differential amplifier 316 includes a first input port I1, a second input port I2, a first output port O1 and a second output port O2. The differential amplifier 316 generates a differential output. The differential output includes a positive output voltage Vo+ 324 and a negative output voltage Vo− 326.

The negative output voltage Vo− 326 is generated at the first output port O1, and the positive output voltage Vo+ 324 is generated at the second output port O2. The second voltage controlled resistor R2v 312 is coupled between the first node N1 and the first input port I1. The third voltage controlled resistor R3v 314 is coupled between the second node N2 and the second input port I2.

A first feedback resistor Rfb1 318 is coupled between the first input port I1 and the first output port O1. A second feedback resistor Rfb2 320 is coupled between the second input port I2 and the second output port O2. It is understood that the impedance network 305 is symmetric. Thus, in an example, when the positive input voltage Vi+ 302 and the negative input voltage Vi− 304 are provided to the second node N2 and the first node N1 respectively, the negative output voltage Vo− 326 and the positive output voltage Vo+ 324 may be generated at second output port O2 and first output port O1 respectively.

The TGC circuit 300 may include one or more additional components known to those skilled in the relevant art and are not discussed here for simplicity of the description.

The operation of the TGC circuit 300 illustrated in FIG. 1 is explained now. In one example, a resistance value of the first fixed resistor R1f 306 and the second fixed resistor R2f 310 are equal. Also, a resistance value of the second voltage controlled resistor R2v 312 and the third voltage controlled resistor R3v 314 are maintained equal when the gain of the TGC circuit 300 is changed. In another example, a resistance value of the first feedback resistor Rfb1 318 and the second feedback resistor Rfb2 230 are equal.

The differential amplifier 316 is at least one of an operational amplifier and a high gain amplifier. In one example, a gain of the differential amplifier 316 is greater than 1000. The TGC circuit 300 receives the differential input (the positive input voltage Vi+ 302 and the negative input voltage Vi− 304).

The impedance network 305 provides a fixed impedance to the differential amplifier 316 when the gain of the TGC circuit 300 is changed from a maximum value to a minimum value. Also, the impedance network 305 provides the fixed impedance to the differential amplifier 316 when the gain of the TGC circuit 300 is changed from the minimum value to the maximum value.

In one example, the gain of the TGC circuit 300 is defined as:

$$\text{Gain} = \frac{R1v \times Rfb1}{R1f \times R1v + R1f \times R2v + R1v \times R2v} \quad (1)$$

The fixed impedance (Zin) provided by the impedance network is defined as:

$$Zin = R2v + \frac{R1f \times R1v}{R1f + R1v} \quad (2)$$

A feedback factor and a bandwidth of the differential amplifier 316 are constant when the gain of the TGC circuit 300 is changed. A change in the gain of the TGC circuit 300 provides a corresponding change in resistance values of the first voltage controlled resistor R1v 308, the second voltage controlled resistor R2v 312 and the third voltage controlled resistor R3v 314, such that the impedance network 305 provides the fixed impedance to the differential amplifier 316.

In one version, when the gain of the TGC circuit 300 is changed from the maximum value to the minimum value, a resistance value of the first voltage controlled resistor R1v 308 is decreased, and a resistance values of the second voltage controlled resistor R2v 312 and the third voltage controlled resistor R3v 314 are increased. Also, resistance values of the first fixed resistor R1f 306 and the second fixed resistor R2f 310 are maintained such that the fixed impedance is provided to the differential amplifier 316. This controls the differential output (the positive output voltage Vo+ 324 and the negative output voltage Vo− 326) of the TGC circuit 300.

In another version, when the gain of the TGC circuit 300 is changed from the minimum value to the maximum value, the resistance value of the first voltage controlled resistor R1v 308 is increased, and the resistance values of the second voltage controlled resistor R2v 312 and the third voltage controlled resistor R3v 314 are decreased. Also, resistance values of the first fixed resistor R1f 306 and the second fixed resistor R2f 310 are maintained such that the fixed impedance is provided to the differential amplifier 316. This controls the differential output (the positive output voltage Vo+ 324 and the negative output voltage Vo− 326) of the TGC circuit 300.

An output of the differential amplifier 316 is the output of the TGC circuit 300. Thus, the resistance values of the first voltage controlled resistor R1v 308, the second voltage controlled resistor R2v 312 and the third voltage controlled resistor R3v 314 are changed such that the impedance network 305 provides the fixed impedance to the differential amplifier 316 and simultaneously achieving a desired gain for the TGC circuit 300.

The TGC circuit 300 requires very less power as compared to the TGC circuit 100 to meet the same noise requirement in an ultrasound system. An output offset provided by the differential amplifier 316 does not change with the change in the gain of the TGC circuit 300. As the feedback factor and the bandwidth of the differential amplifier 316 are constant when the gain of the TGC circuit 300 is changed, a same phase response is achieved for the differential input across the gain of the TGC circuit 300.

In addition, a noise of the differential amplifier 316 remains same across the gain of the TGC circuit 300 as the feedback factor of the differential amplifier 316 is constant. In one example, a control voltage required for changing the resistance of the first voltage controlled resistor R1v 308, the second voltage controlled resistor R2v 312 and the third voltage controlled resistor R3v 314 is provided by a differential circuit. The TGC circuit 300 finds application in both portable and high-end ultrasound systems. The TGC circuit 300 achieves lower noise with lower power.

Figure 4:
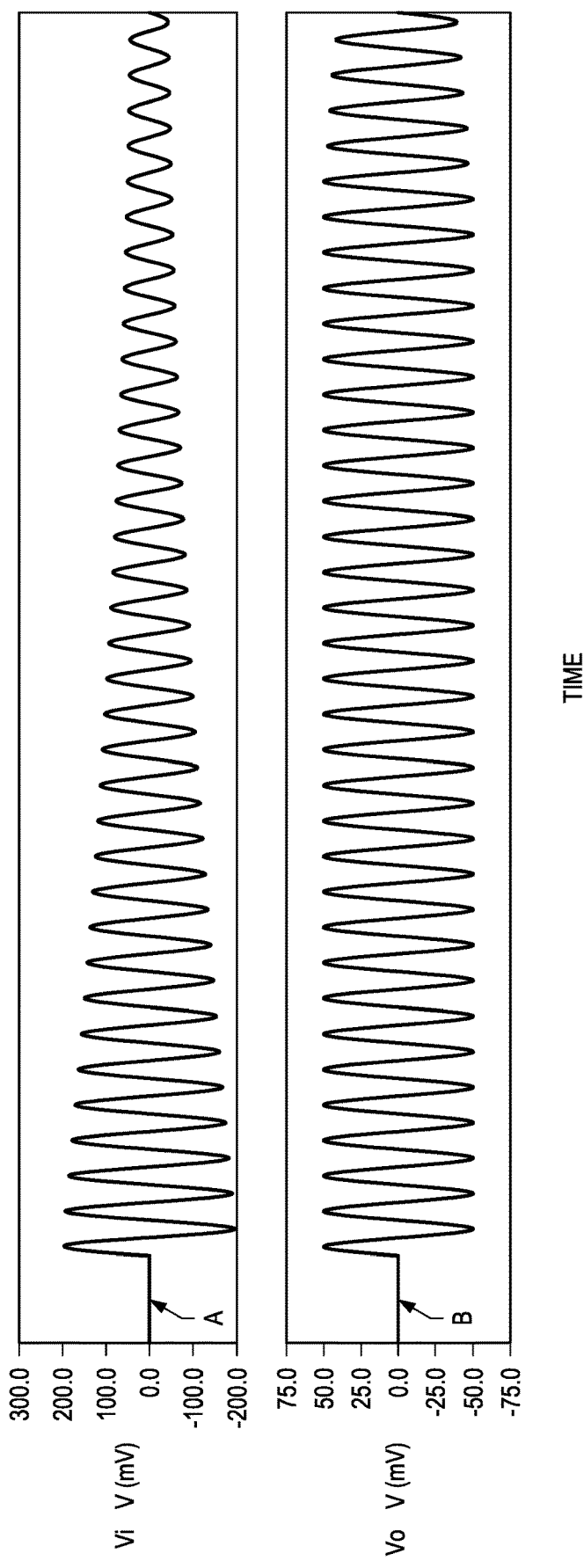
FIG. 4 illustrates a differential input and a differential output curves of the time gain compensation (TGC) circuit illustrated in FIG. 3, according to an embodiment.

FIG. 4 illustrates a differential input and a differential output curves of the time gain compensation (TGC) circuit 300, according to an embodiment. Curve A represents the differential input (Vi) provided to the TGC circuit 300, and curve B represents the differential output (Vo) of the TGC circuit 300. The differential input (Vi) represents the positive input voltage Vi+ 302 and the negative input voltage Vi− 304. The differential output (Vo) represents the positive output voltage Vo+ 324 and the negative output voltage Vo− 326.

As illustrated in curve A, the differential input (Vi) gets attenuated with time. The TGC circuit 300 provides a higher gain when the differential input (Vi) is of lower intensity, and a lower gain when the differential input (Vi) is of high intensity. Thus, the curve B is obtained where the differential output (Vo) has a constant magnitude with time.

As the feedback factor and the bandwidth of the differential amplifier 316 are constant when the gain of the TGC circuit 300 is changed, a same phase response is achieved for the differential input across the gain of the TGC circuit 300. In addition, a noise of the differential amplifier 316 remains same across the gain of the TGC circuit 300 as the feedback factor of the differential amplifier 316 is constant.

Figure 5:
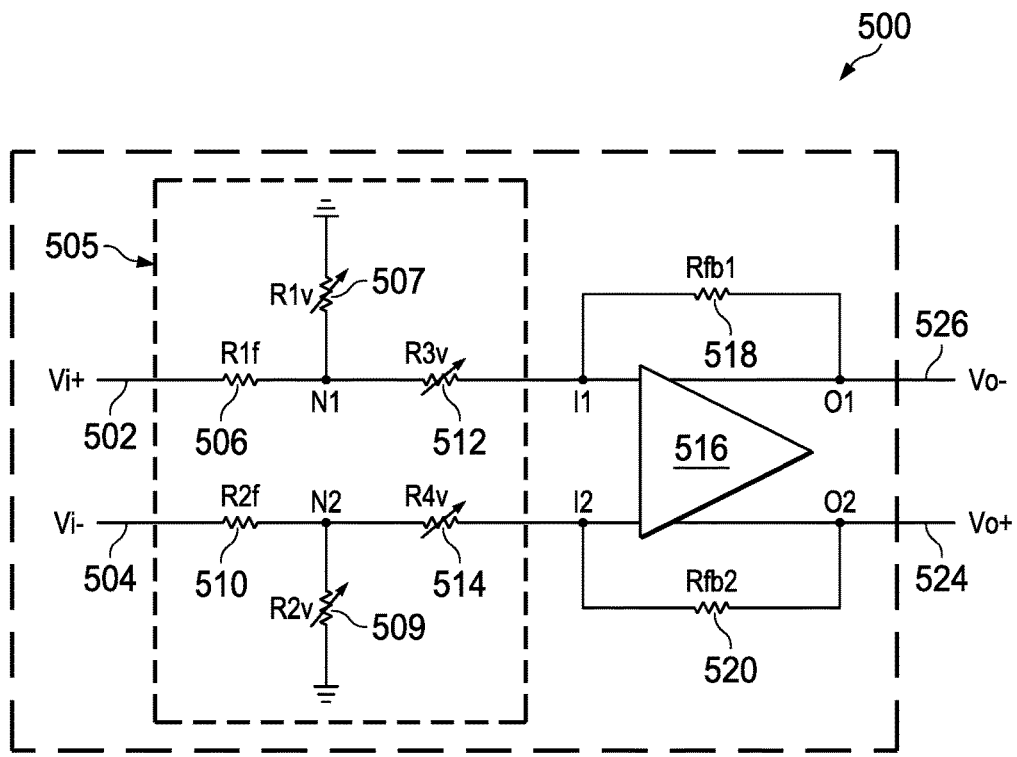
FIG. 5 illustrates a time gain compensation (TGC) circuit, according to an embodiment.

FIG. 5 illustrates a time gain compensation (TGC) circuit 500, according to an embodiment. The TGC circuit 500 receives a differential input. The differential input includes a positive input voltage Vi+ 502 and a negative input voltage Vi− 504. An impedance network 505 receives the positive input voltage Vi+ 502 and the negative input voltage Vi− 504.

The impedance network 505 includes a first fixed resistor R1f 506, a second fixed resistor R2f 510, a first voltage controlled resistor R1v 507, a second voltage controlled resistor R2v 509, a third voltage controlled resistor R3v 512 and a fourth voltage controlled resistor R4v 514. In one version, the impedance network 505 includes one or more voltage controlled resistors.

The first fixed resistor R1f 506 and the second fixed resistor R2f 510 are fixed resistors. The first voltage controlled resistor R1v 507, the second voltage controlled resistor R2v 509, the third voltage controlled resistor R3v 512 and the fourth voltage controlled resistor R4v 514 are voltage controlled resistors.

The first fixed resistor R1f 506 is coupled to a first node N1 and receives the positive input voltage Vi+ 502. The second fixed resistor R2f 510 is coupled to a second node N2 and receives the negative input voltage Vi− 504. The first voltage controlled resistor R1v 507 is coupled between the first node N1 and a ground terminal. The second voltage controlled resistor R2v 509 is coupled between the second node N2 and the ground terminal.

A differential amplifier 516 is coupled to the impedance network 505. The differential amplifier 516 includes a first input port I1, a second input port I2, a first output port O1 and a second output port O2. The differential amplifier 516 generates a differential output. The differential output includes a positive output voltage Vo+ 524 and a negative output voltage Vo− 526.

The negative output voltage Vo− 526 is generated at the first output port O1, and the positive output voltage Vo+ 524 is generated at the second output port O2. The third voltage controlled resistor R3v 512 is coupled between the first node N1 and the first input port I1. The fourth voltage controlled resistor R4v 514 is coupled between the second node N2 and the second input port I2.

A first feedback resistor Rfb1 518 is coupled between the first input port I1 and the first output port O1. A second feedback resistor Rfb2 520 is coupled between the second input port I2 and the second output port O2. It is understood that the impedance network 505 is symmetric. Thus, in an example, when the positive input voltage Vi+ 502 and the negative input voltage Vi− 504 are provided to the second node N2 and the first node N1 respectively, the negative output voltage Vo− 526 and the positive output voltage Vo+ 524 may be generated at second output port O2 and first output port O1 respectively.

The TGC circuit 500 may include one or more additional components known to those skilled in the relevant art and are not discussed here for simplicity of the description.

The operation of the TGC circuit 500 is explained now. In one example, a resistance value of the first fixed resistor R1f 506 and the second fixed resistor R2f 510 are equal. Also, a resistance value of the first voltage controlled resistor R1v 507 and the second voltage controlled resistor R2v 509 are maintained equal when the gain of the TGC circuit 500 is changed.

Also, a resistance value of the third voltage controlled resistor R3v 512 and the fourth voltage controlled resistor R4v 514 are maintained equal when the gain of the TGC circuit 500 is changed. In another example, a resistance value of the first feedback resistor Rfb1 518 and the second feedback resistor Rfb2 520 are equal.

The differential amplifier 516 is at least one of an operational amplifier and a high gain amplifier. In one example, a gain of the differential amplifier 516 is greater than 1000. The TGC circuit 500 receives the differential input (the positive input voltage Vi+ 502 and the negative input voltage Vi− 504).

The impedance network 505 provides a fixed impedance to the differential amplifier 516 when the gain of the TGC circuit 500 is changed from a maximum value to a minimum value. Also, the impedance network 505 provides the fixed impedance to the differential amplifier 516 when the gain of the TGC circuit 500 is changed from the minimum value to the maximum value.

A feedback factor and a bandwidth of the differential amplifier 516 are constant when the gain of the TGC circuit 500 is changed. A change in the gain of the TGC circuit 500 provides a corresponding change in resistance values of the first voltage controlled resistor R1v 507, the second voltage controlled resistor R2v 509, the third voltage controlled resistor R3v 512 and the fourth voltage controlled resistor R4v 514, such that the impedance network 505 provides the fixed impedance to the differential amplifier 516.

In one version, when the gain of the TGC circuit 500 is changed from the maximum value to the minimum value, a resistance values of the first voltage controlled resistor R1v 508 and the second voltage controlled resistor R2v 509 are decreased, and a resistance values of the third voltage controlled resistor R3v 512 and the fourth voltage controlled resistor R4v 514 are increased. Also, resistance values of the first fixed resistor R1f 506 and the second fixed resistor R2f 510 are maintained such that the fixed impedance is provided to the differential amplifier 516. This controls the differential output (the positive output voltage Vo+ 524 and the negative output voltage Vo− 526) of the TGC circuit 500.

In another version, when the gain of the TGC circuit 500 is changed from the minimum value to the maximum value, the resistance values of the first voltage controlled resistor R1v 508 and the second voltage controlled resistor R2v 509 are increased, and the resistance values of the third voltage controlled resistor R3v 512 and the fourth voltage controlled resistor R4v 514 are decreased. Also, resistance values of the first fixed resistor R1f 506 and the second fixed resistor R2f 510 are maintained such that the fixed impedance is provided to the differential amplifier 516. This controls the differential output (the positive output voltage Vo+ 524 and the negative output voltage Vo− 526) of the TGC circuit 500.

An output of the differential amplifier 516 is the output of the TGC circuit 500. Thus, the resistance values of the first voltage controlled resistor R1v 507, the second voltage controlled resistor R2v 509, the third voltage controlled resistor R3v 512 and the fourth voltage controlled resistor R4v 514 are changed such that the impedance network 505 provides the fixed impedance to the differential amplifier 516 and simultaneously achieving a desired gain for the TGC circuit 500.

The TGC circuit 500 requires very less power as compared to the TGC circuit 100 to meet the same noise requirement in an ultrasound system. An output offset provided by the differential amplifier 516 does not change with the change in the gain of the TGC circuit 500. As the feedback factor and the bandwidth of the differential amplifier 516 are constant when the gain of the TGC circuit 500 is changed, a same phase response is achieved for the differential input across the gain of the TGC circuit 500. The TGC circuit 500 provides for accurate imaging in an ultrasound system using TGC circuit 500.

In addition, a noise of the differential amplifier 516 remains same across the gain of the TGC circuit 500 as the feedback factor of the differential amplifier 516 is constant. In one example, a control voltage required for changing the resistance of the first voltage controlled resistor R1v 508, the second voltage controlled resistor R2v 512 and the third voltage controlled resistor R3v 514 is provided by a differential circuit. The TGC circuit 500 finds application in both portable and high-end ultrasound systems. The TGC circuit 500 achieves lower noise with lower power.

Figure 6:
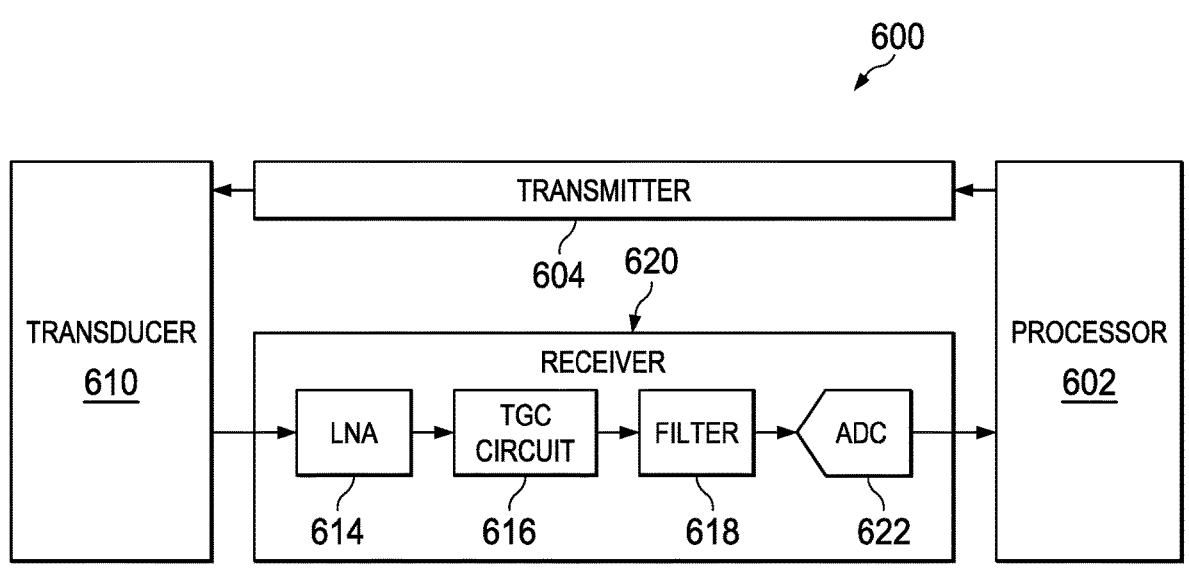
FIG. 6 illustrates a block diagram of an ultrasound system, according to an embodiment.

FIG. 6 illustrates a block diagram of an ultrasound system 600, according to an embodiment. The ultrasound system 600 includes a processor 602, a transmitter 604, a transducer 610 and a receiver 620. The ultrasound system 600 is illustrative, and real-world implementations may contain more blocks/components and/or different arrangement of the blocks/components.

The transmitter 604 transmits a pulse signal. The transmitter 604 receives a data representing a pulse signal from the processor 602. In one example, the transmitter 604 performs several operations on the data received from the processor 602. The operations include, but not limited to, filtering and amplification.

The transducer 610 receives the pulse signal from the transmitter 604. The transducer 610 converts electrical signals to ultrasound signals. In one example, the transducer 610 includes an array of transducers. The ultrasound signals are transmitted to the subject's body, and, in response, echoes of the ultrasound signals are reflected from various acoustic impedance discontinuities within the body.

Thus, the transducer 610 receives one or more reflected ultrasound signals. The transducer 610 convert the reflected ultrasound signals to one or more reflected electrical signals. The receiver 620 receives the one or more reflected electrical signals. The receiver 620 may be implemented on an integrated circuit.

The receiver 620 includes a low noise amplifier (LNA) 614, a time gain compensation (TGC) circuit, a filter 618 and an analog to digital converter (ADC) 622. The low noise amplifier (LNA) 614, the time gain compensation (TGC) circuit 616, the filter 618 and the ADC 622 form a processing chain. In one version, the receiver 620 includes a plurality of processing chains.

Each processing chain of the plurality of processing chains process a reflected electrical signal of the one or more reflected electrical signals. The LNA 614 receives one of the one or more reflected electrical signals as an input signal and generates an amplified signal. The TGC circuit 616 receives the amplified signal. The TGC circuit 616 is analogous in connection and operation to at least one of the TGC circuit 300 and the TGC circuit 500.

The TGC circuit 616 requires very less power to meet the noise requirements in the ultrasound system 600. The TGC circuit 616 achieves lower noise with lower power. The TGC circuit 616 is used in an ultrasound system 600 to correct the intensity of the reflected electrical signal so that the intensities are the same for the reflected electrical signal received from tissues deep within the body as they are for similar tissues close to the surface of the body.

The filter 618 receives an output of the TGC circuit 616. In one example, the filter 618 is an anti-aliasing filter. In another example, the filter 618 is a low pass filter. The filter 618 generates a filtered output. An ADC 622 is coupled to the filter 618 and generates a digital data in response to the filter output.

The processor 602 is coupled to the ADC 622. The processor 602 can be, for example, a CISC-type (Complex Instruction Set Computer) CPU, RISC-type CPU (Reduced Instruction Set Computer), or a digital signal processor (DSP). The processor 602 processes the digital data to generate an ultrasound image of a subject.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

The invention claimed is:

1. An ultrasound system comprising:
a transmitter configured to transmit a pulse signal;
a receiver configured to receive one or more electrical signals, the receiver having processing chains, at least one of the processing chains including:
  a low noise amplifier (LNA) configured to receive one of the one or more electrical signals as an input signal and provide an amplified signal; and
  a time gain compensation (TGC) circuit configured to receive the amplified signal, the TGC circuit having:
    an impedance network that includes:
      a first fixed resistor coupled to a first node and configured to receive a positive input voltage;
      a second fixed resistor coupled to a second node and configured to receive a negative input voltage;
      a first voltage controlled resistor coupled between the first node and ground;
      a second voltage controlled resistor coupled between the second node and ground;
      a third voltage controlled resistor coupled between the first node and a first input;
      a fourth voltage controlled resistor coupled between the second node and a second input;
    a differential amplifier having the first and second inputs, a first output and a second output; and
    a first feedback resistor coupled between the first input and the first output; and
    a second feedback resistor coupled between the second input and the second output, the impedance network providing a fixed impedance to the differential amplifier when a gain of the TGC circuit is changed from a maximum value to a minimum value or from the minimum value to the maximum value.

2. The ultrasound system of claim 1 further comprising:
a filter configured to receive an output of the TGC circuit as an input and provide a filtered output at the first and second outputs;
an analog to digital converter (ADC) configured to provide digital data in response to the filter output; and
a processor coupled to the ADC and configured to process the digital data.

3. The ultrasound system of claim 1, wherein the differential amplifier includes an operational amplifier.

4. The ultrasound system of claim 1, wherein a feedback factor and a bandwidth of the differential amplifier are constant when the gain of the TGC circuit is changed.

5. The ultrasound system of claim 1, wherein a change in the gain of the TGC circuit provides a corresponding change in resistance values of the first voltage controlled resistor, the second voltage controlled resistor and the third voltage controlled resistor, such that the impedance network provides the fixed impedance to the differential amplifier.

6. The ultrasound system of claim 1, wherein the differential amplifier includes a high gain amplifier having a gain of at least 100.

7. The ultrasound system of claim 1, further comprising:
a transducer configured to receive the pulse signal and to output the one or more electrical signals to the receiver, the transducer further configured to transmit one or more ultrasound signals toward one or more external objects, receive one or more reflected ultrasound signals, and convert the one or more reflected ultrasound signals to the one or more electrical signals.

8. A receiver comprising:
a low noise amplifier (LNA) having an input and an output; and
a time gain compensation (TGC) circuit having an input and output wherein the input is coupled to the output of the LNA:
an impedance network that includes:

a first fixed resistor coupled to a first node and configured to receive a positive input voltage;

a second fixed resistor coupled to a second node and configured to receive a negative input voltage;

a first voltage-controlled resistor coupled between the first node and ground;

a second voltage-controlled resistor coupled between the second node and ground;

a third voltage-controlled resistor coupled between the first node and a first input;

a fourth voltage-controlled resistor coupled between the second node and a second input;

a differential amplifier having the first and second inputs, a first output and a second output; and a first feedback resistor coupled between the first input and the first output; and a second feedback resistor coupled between the second input and the second output, the impedance network providing a fixed impedance to the differential amplifier when a gain of the TGC circuit is changed from a maximum value to a minimum value or from the minimum value to the maximum value.

9. The receiver of claim 8 further comprising:

a filter configured to receive the output of the TGC circuit as an input and provide a filtered output at the first and second outputs;

an analog to digital converter (ADC) configured to provide digital data in response to the filter output; and a processor coupled to the ADC and configured to process the digital data.

10. The receiver of claim 8, wherein the differential amplifier includes an operational amplifier.

11. The receiver of claim 8, wherein a feedback factor and a bandwidth of the differential amplifier are constant when the gain of the TGC circuit is changed.

12. The receiver of claim 8, wherein a change in the gain of the TGC circuit provides a corresponding change in resistance values of the first voltage-controlled resistor, the second voltage-controlled resistor and the third voltage-controlled resistor, such that the impedance network provides the fixed impedance to the differential amplifier.

13. The receiver of claim 8, wherein the differential amplifier includes a high gain amplifier having a gain of at least 100.

14. A time gain compensation circuit (TGC) comprising:
an impedance network that includes:

a first fixed resistor coupled to a first node and configured to receive a positive input voltage;

a second fixed resistor coupled to a second node and configured to receive a negative input voltage;

a first voltage-controlled resistor coupled between the first node and ground;

a second voltage-controlled resistor coupled between the second node and ground;

a third voltage-controlled resistor coupled between the first node and a first input;

a fourth voltage-controlled resistor coupled between the second node and a second input;

a differential amplifier having the first and second inputs, a first output and a second output; and a first feedback resistor coupled between the first input and the first output; and a second feedback resistor coupled between the second input and the second output, the impedance network providing a fixed impedance to the differential amplifier when a gain of the TGC circuit is changed from a maximum value to a minimum value or from the minimum value to the maximum value.

15. The TGC of claim 14 further comprising:

a filter configured to receive the output of the TGC circuit as an input and provide a filtered output at the first and second outputs;

an analog to digital converter (ADC) configured to provide digital data in response to the filter output; and a processor coupled to the ADC and configured to process the digital data.

16. The TGC of claim 14, wherein the differential amplifier includes an operational amplifier.

17. The TGC of claim 14, wherein a feedback factor and a bandwidth of the differential amplifier are constant when the gain of the TGC circuit is changed.

18. The TGC of claim 14, wherein a change in the gain of the TGC circuit provides a corresponding change in resistance values of the first voltage-controlled resistor, the second voltage-controlled resistor and the third voltage-controlled resistor, such that the impedance network provides the fixed impedance to the differential amplifier.

19. The TGC of claim 14, wherein the differential amplifier includes a high gain amplifier having a gain of at least 100.

* * * * *